United States Patent
Lee et al.

(10) Patent No.: US 12,328,932 B2
(45) Date of Patent: Jun. 10, 2025

(54) METAL-OXIDE SEMICONDUCTOR FIELD EFFECT TRANSISTOR DEVICE AND MANUFACTURING METHOD THEREFOR

(71) Applicant: LG ELECTRONICS INC., Seoul (KR)

(72) Inventors: Hojung Lee, Seoul (KR); Seung Yup Jang, Seoul (KR); Jaemoo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 525 days.

(21) Appl. No.: 17/797,224

(22) PCT Filed: Feb. 6, 2020

(86) PCT No.: PCT/KR2020/001684
§ 371 (c)(1),
(2) Date: Aug. 3, 2022

(87) PCT Pub. No.: WO2021/157761
PCT Pub. Date: Aug. 12, 2021

(65) Prior Publication Data
US 2023/0060069 A1   Feb. 23, 2023

(51) Int. Cl.
*H10D 84/00*   (2025.01)
*H01L 21/04*   (2006.01)
(Continued)

(52) U.S. Cl.
CPC ....... *H10D 84/146* (2025.01); *H01L 21/0465* (2013.01); *H10D 12/031* (2025.01); *H10D 62/393* (2025.01); *H10D 62/8325* (2025.01)

(58) Field of Classification Search
CPC ........ H10D 30/0291–0297; H10D 30/66–669; H10D 62/393; H10D 62/152–155
See application file for complete search history.

(56) References Cited

U.S. PATENT DOCUMENTS 6,049,104 A * 4/2000 Hshieh ................... H10D 30/66
  438/944
6,238,980 B1 * 5/2001 Ueno ................. H10D 62/8325
  257/E29.066

(Continued)

FOREIGN PATENT DOCUMENTS

JP           6267706 B2    1/2018
KR       10-0206193 B1    7/1999
(Continued)

*Primary Examiner* — Eric A. Ward
(74) *Attorney, Agent, or Firm* — Birch, Stewart, Kolasch & Birch, LLP

(57) ABSTRACT

The present disclosure relates to: a MOSFET device which is applicable to a semiconductor device and, particularly, is manufactured using silicon carbide; and a manufacturing method therefor. The present disclosure provides a metal-oxide-semiconductor field effect transistor device which may comprise: a drain electrode; a substrate disposed on the drain electrode; an N-type drift layer disposed on the substrate; a plurality of P-type well layer regions disposed on the drift layer and spaced apart from each other to define a channel; an N+ region disposed on the well layer regions and adjacent to the channel; a P+ region disposed at the other side of the channel; a gate oxide layer disposed on the drift layer; a gate layer disposed on the gate oxide layer; and a source electrode disposed on the gate layer.

10 Claims, 30 Drawing Sheets

(51) Int. Cl.
  *H10D 12/01*    (2025.01)
  *H10D 62/17*    (2025.01)
  *H10D 62/832*   (2025.01)

(56) References Cited

U.S. PATENT DOCUMENTS

| | | | | |
|---|---|---|---|---|
| 6,351,018 B1 * | 2/2002 | Sapp | .................... | H10D 64/117 |
| | | | | 438/179 |
| 2004/0140512 A1 * | 7/2004 | Saggio | ................ | H10D 64/518 |
| | | | | 257/E21.418 |
| 2006/0084209 A1 | 4/2006 | Hsu | | |
| 2010/0048004 A1 * | 2/2010 | Hashimoto | ........ | H10D 62/8325 |
| | | | | 257/E21.334 |
| 2014/0175508 A1 * | 6/2014 | Suzuki | .................... | H10D 8/60 |
| | | | | 257/140 |
| 2016/0111533 A1 * | 4/2016 | Yen | ................... | H10D 62/8325 |
| | | | | 257/77 |
| 2019/0013312 A1 * | 1/2019 | Saggio | ................ | H10D 62/106 |
| 2020/0091295 A1 * | 3/2020 | Ohashi | ................ | H10D 62/393 |

FOREIGN PATENT DOCUMENTS

| KR | 10-1550798 B1 | 9/2015 |
|---|---|---|
| WO | WO 03/043089 A1 | 5/2003 |

* cited by examiner

METAL-OXIDE SEMICONDUCTOR FIELD EFFECT TRANSISTOR DEVICE AND MANUFACTURING METHOD THEREFOR

CROSS REFERENCE TO RELATED APPLICATIONS

This application is the National Phase of PCT International Application No. PCT/KR2020/001684, filed on Feb. 6, 2020, which is hereby expressly incorporated by reference into the present application.

TECHNICAL FIELD

The present disclosure is applicable to a semiconductor device, and particularly, relates to a MOSFET device made of silicon carbide and a manufacturing method therefor.

BACKGROUND ART

Compared to silicon (Si), silicon carbide (SiC) has physical properties such as high breakdown voltage, excellent heat dissipation characteristics, and high temperature operation, and thus a power semiconductor device using SiC has attracted as an alternative to an existing silicon device.

In particular, a silicon carbide MOSFET device made based on these characteristics may propose a solution to replace silicon IGBT (Insulated gate bipolar transistor) and silicon cool MOSFET and to increase power density of a power conversion device. Accordingly, such a silicon carbide MOSFET device has been actively researched and developed in an application field such as a white good, an electric vehicle, and an ESS (energy storage system).

In general, in such a MOSFET device, N⁻-type and P⁻-type doped regions having various concentrations, each of which includes a well layer forming a channel region, can be formed by ion implantation. The channel region is defined by the well layer and the N+ region, forming the channel region symmetrically and accurately may be of importance to device characteristics.

However, when forming the channel region, an N+ region may be formed to extend to an undesired place. Specifically, the N+ region may be formed to extend to a place where a P+ region should be formed.

As a result, since the P+ region is formed on the N+ region, it may be impossible to stably maintain an electrical level of the well layer region serving as a contact of the P+ region by co-implantation of P+ and N+ ions. In addition, during reverse operation of the MOSFET device, reverse conductivity indicating resistance of the MOSFET device may be degraded so that the overall power conversion efficiency can be reduced.

In order to prevent such a phenomenon, a mask layer may be additionally used, or a new ion implantation process condition or an etching process development is required. In addition, an increase in production costs caused by addition of such unnecessary processes may act as a disadvantage of weakening the market competitiveness of the manufactured devices.

In addition, when a Schottky barrier diode (SBD) is directly integrated in a conventional MOSFET device, a cell pitch may increase, and thus RonA may also increase.

DISCLOSURE

Technical Problem

An object of the present disclosure is to provide a metal-oxide semiconductor field effect transistor device capable of preventing performance deterioration of a device affected by co-implantation, and a method for manufacturing the same.

Another object of the present disclosure is to provide a metal-oxide semiconductor field effect transistor device capable of integrating a Schottky barrier diode (SBD) without increasing a pitch of a unit element, and a method for manufacturing the same.

Another object of the present disclosure is to provide a metal-oxide semiconductor field effect transistor device capable of preventing deterioration of contact performance of a MOSFET device by preventing co-implantation in which a P+ region is formed in a portion where an N+ region is formed without using an additional mask, and a method for manufacturing the same.

In addition, it is not necessary for an additional mask layer to be used in the manufacturing process of the device, and reverse conductivity of the device can be improved by adding the Schottky barrier diode (SBD) to the device without increasing RonA.

Technical Solutions

In accordance with a first aspect of the present disclosure, a metal-oxide semiconductor field effect transistor (MOSFET) device may include a drain electrode, a substrate disposed on the drain electrode, an N-type drift layer disposed on the substrate, a plurality of P-type well layer regions disposed on the drift layer and spaced apart from each other to define a channel, an N+ region located on the well layer region and neighboring the channel, a P+ region disposed at the other side of the channel, a gate oxide layer disposed on the drift layer, a gate layer disposed on the gate oxide layer, and a source electrode disposed on the gate layer.

In a first region of the device, two neighboring well layer regions from among the plurality of well layer regions may be separated from each other by the P+ region.

The MOSFET device may further include a second region spaced apart from the first region and formed to include a Schottky contact region.

The Schottky contact region may be disposed between the two neighboring well layer regions.

The Schottky contact region may form a portion of a Schottky barrier diode (SBD).

The first region and the second region may be spaced apart from each other in a longitudinal direction of the source electrode.

A width between two neighboring well layer regions in the first region may be substantially the same as a width between two neighboring well layer regions in the second region.

At least one of the first region and the second region may be repeatedly arranged in a direction perpendicular to an arrangement direction of the well layer regions.

In accordance with a second aspect of the present disclosure, a method for manufacturing a metal-oxide semiconductor field effect transistor (MOSFET) device may include forming a first mask for forming a plurality of arranged well layer regions on the drift layer, forming a plurality of well layer regions using the first mask, forming a second mask on the first mask and the well layer regions; selectively removing the second mask, forming an N+ region on each well layer region using the second mask, removing the first mask and the second mask, forming a third mask covering neighboring N+ regions, and forming a P+ region using the third mask.

The forming the P+ region may include forming the P+ region between the two well layer regions separated from each other.

The first mask may be configured such that mask regions having different widths are alternately formed along a surface of the drift layer.

The second mask may be continuously disposed on the first mask and the well layer region.

At least one of forming the plurality of well layer regions, forming the N+ region, and forming the P+ region may be formed by ion implantation.

The forming the P+ region using the third mask may be performed in a first region of the device.

The method may further include forming a Schottky contact region in a second region spaced apart from the first region.

In the forming the Schottky contact region, the P+ region may not be formed in the second region.

The first region and the second region may be spaced apart from each other in a direction perpendicular to an arrangement direction of the well layer regions.

At least one of the first region and the second region may be repeatedly arranged in a direction perpendicular to an arrangement direction of the well layer regions.

Advantageous Effects

As is apparent from the above description, the embodiments of the present disclosure have the following effects.

According to one embodiment of the present disclosure, there is no difficulty in the manufacturing process because an additional mask layer need not be used in the manufacturing process, and reverse conductivity can be improved by adding the Schottky barrier diode (SBD) to the device without increasing RonA.

The present disclosure can prevent deterioration of contact performance of a MOSFET device by preventing co-implantation in which the P+ region is formed in a portion where the N+ region is formed without using an additional mask.

In addition, the Schottky barrier diode (SBD) can be integrated without increasing the pitch of a unit element, and reverse conductivity can be improved without increasing RonA.

Furthermore, according to another embodiment of the present disclosure, there are additional technical effects not mentioned herein. Those skilled in the art will appreciate such technical effects through the whole of the specification and drawings.

BEST MODEL

Figure 1:
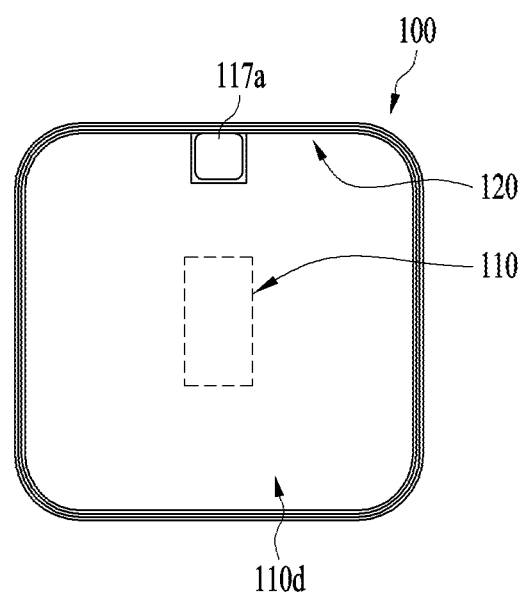
FIG. 1 is a plan view illustrating a metal-oxide semiconductor field effect transistor device according to an embodiment of the present disclosure.

Hereinafter, the present disclosure will be described in detail by explaining exemplary embodiments of the present disclosure with reference to the attached drawings. The same reference numerals in the drawings denote like elements, and a repeated explanation thereof will not be given. The suffixes "module" and "unit" of elements herein are used for convenience of description and thus can be used interchangeably, and do not have any distinguishable meanings or functions. In the following description of the at least one embodiment, a detailed description of known functions and configurations incorporated herein will be omitted fur the purpose of clarity and for brevity. The features of the present disclosure will be more clearly understood from the accompanying drawings and should not be understood to be limited by the accompanying drawings, and it is to be appreciated that all changes, equivalents, and substitutes that do not depart from the spirit and technical scope of the present disclosure are encompassed in the present disclosure.

Furthermore, although each drawing is described for convenience of description, it is also within the scope of the present disclosure that those skilled in the art implement other embodiments by combining at least two or more drawings.

When an element, such as a layer, a region, or a substrate, is referred to as being "on" another component, it may be directly on another element or an intervening element may be present therebetween.

Figure 2:
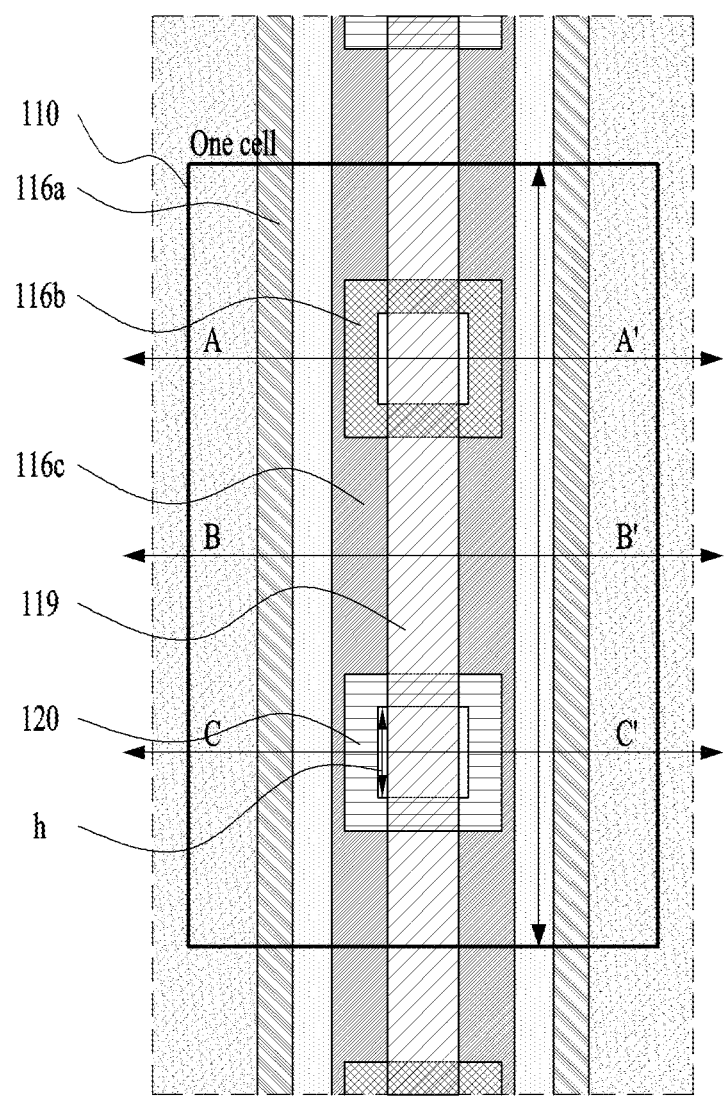
FIG. 2 is a plan view illustrating a portion of FIG. 1.

FIG. 1 is a plan view illustrating a metal-oxide semiconductor field effect transistor device according to an embodiment of the present disclosure. FIG. 2 is a plan view illustrating a portion of FIG. 1.

Referring to FIG. 1, a metal-oxide semiconductor field effect transistor (MOSFET) device 100 according to an embodiment of the present disclosure may include an active region 110 and an edge region 120. Hereinafter, the convenience of description, the metal-oxide semiconductor field effect transistor (MOSFET) device 100 is referred to as the MOSFET device 100 for short.

The present disclosure relates to a silicon carbide (SiC) MOSFET device 100. Compared to silicon (Si), silicon carbide (SiC) has physical properties such as high breakdown voltage, excellent heat dissipation characteristics, and high temperature operation, and thus a power semiconductor device using SiC has attracted as an alternative to an existing silicon device.

In particular, a silicon carbide (SiC) MOSFET device made based on these characteristics may propose a solution to replace silicon IGBT (Insulated gate bipolar transistor) and silicon cool MOSFET and to increase power density of a power conversion device. Accordingly, such a silicon carbide MOSFET device has been actively researched and developed in an application field such as a white good, an electric vehicle, and an ESS (energy storage system).

In FIG. 1, the active region 110 may be disposed at the center of the MOSFET device 100, and a structure of the same unit element (i.e., one cell) 110a as shown in FIG. 2 may be repeatedly disposed in the active region 110.

The edge region 120 may include a plurality of ring structures (not shown) spaced apart from each other, and the ring structures may be configured to improve withstand voltage characteristics in the edge region 120.

FIG. 1 shows one unit cell 110a from among the active region 110 of the MOSFET device 100. In FIG. 1, the size of the unit cell 110a is schematically illustrated, the scope of the present disclosure is not limited thereto, and the actual ratio of the unit cell 110a may also be different from that shown in FIG. 1.

Referring to FIG. 2, two regions may be disposed in one unit cell 110a. That is, in FIG. 2, a portion taken along the line A-A' may be a first region, and a portion taken along the line C-C' may be a second region.

More specifically, when the first region is defined locally, the first region may refer to the inside of a P+ region 116b of the portion taken along the line A-A'. In addition, when the second region is defined locally, the second region may refer to the inside of a well layer region 116a of the portion taken along the line C-C' or may refer to a region between the well layer regions 116a.

The second region may include a Schottky contact region. Specifically, when the P+ region 116b is not formed in the second region, the Schottky contact region 114a (see FIG. 4 and FIG. 5) may be naturally formed. The second region including the Schottky contact region 114a may operate as a Schottky barrier diode (SBD).

The first region and the second region may be spaced apart from each other along the longitudinal direction of a source electrode 119.

In addition, the width between two neighboring well layer regions 116a in the first region may be substantially the same as the width between two neighboring well layer regions 116a in the second region.

As described above, at least one of the first region and the second region may be repeatedly disposed in the unit cell 110a in a direction perpendicular to the arrangement direction of the well layer region 116a.

In FIG. 2, the portion taken along the line B-B' may correspond to a portion located between the first region and the second region.

In FIG. 2, a plurality of layers may be illustrated in an overlapping manner, so that distinction between the layers may be unclear. Accordingly, the features of the present disclosure will hereinafter be described in detail with reference to the cross-sectional views of each portion.

Figure 3:
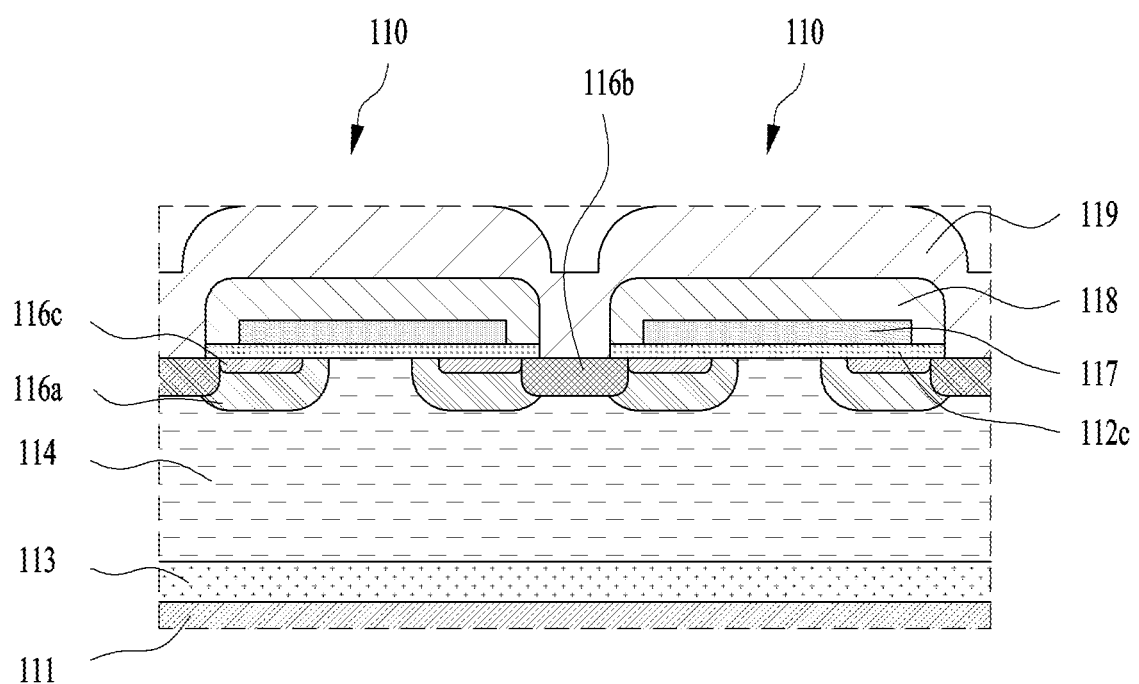
FIG. 3 is a cross-sectional view illustrating a portion taken along the line A-A' of FIG. 2.

FIG. 3 is a cross-sectional view illustrating the portion taken along the line A-A' of FIG. 2.

Hereinafter, the structure of a separate unit element 110a will be described in detail with reference to FIG. 3.

A drain electrode 111 may be disposed at a lower side of the separate unit element 110. A source electrode 119 may be disposed at an upper side of the unit element 110. That is, the separate MOSFET unit element 110 may have a vertical structure in which current flows in a vertical direction of the unit element 110.

A substrate 113 may be positioned on the drain electrode 111. A first contact layer 112a may be disposed between the drain electrode 111 and the substrate 113 to aid contact between the drain electrode 111 and the substrate 113. The first contact layer 112a may be formed of Ni silicide.

A drift layer 114 may be disposed on the substrate 113. The drift layer 114 may be a silicon carbide (SiC) substrate or an epitaxial layer, and for example, may be 4H poly-type silicon carbide. Hereinafter, epitaxial growth in the specification may refer to a growth method using a raw material, such as CVD (Chemical vapor deposition).

A P-type well layer (P-Well) 116a formed to be spaced apart from each other to form (or define) a channel may be disposed at both sides of the unit element on the drift layer 114. A portion of the drift layer 114 disposed between the well layer regions 116a may be a current diffusion layer region.

Although not separately shown, the current diffusion layer may be formed by thin film growth or ion implantation. The current diffusion layer may include a dopant. That is, the current diffusion layer may be formed by introducing a dopant during thin film growth, or may be formed by ion implantation after thin film growth. Accordingly, the current diffusion layer may have higher conductivity than the drift layer 114.

As shown, the well layer regions 116a may be disposed symmetrical to the current diffusion layer region located between the well layer regions 116a.

A gate oxide layer 112c may be disposed on the P-type well layer region 116a. At this time, a channel may be formed between the P-type well layer regions 116a formed to be spaced apart from each other, and/or may be formed in a portion where the P-type well layer region 116a contacts the gate oxide layer 112c.

On the other hand, the N+ region 116c neighboring the channel may be disposed on each well layer region 116a. The width of the N+ region 116c may be smaller than the width of each well layer region 116a.

In addition, the P+ region 116b may be disposed between the well layer regions 116a located between the unit elements 110a. Referring to FIG. 3, the well layer regions 116a may not be connected to each other in a portion between the unit elements 110a. That is, the P+ region 116b may be disposed between two well layer regions 116a in the portion between the unit elements 110a. As described above, two well layer regions 116a may be disconnected from each other by the P+ region 116b in the portion between the unit elements 110a.

On the well layer regions 116a, two N+ regions 116c disposed symmetrical to the current diffusion layer region may be located in the unit element 110a in a portion neighboring the channel region, and the P+ region 116b may be located outside the N+ region 116c.

Here, the P+ region 116b may have a higher doping concentration than the P-type well layer region 116a. That is, P+ may mean a doping concentration higher than P. Similarly, the N+ region 116c may have a higher doping concentration than the N-type drift layer 114. That is, N+ may mean a doping concentration higher than N.

At this time, the P+ region 116b may be thicker than the N+ region 116c. In addition, the P+ region 116b may be connected to the neighboring unit element 110a. In other words, the P+ region 116b may be located at a boundary between the neighboring unit elements 110a.

The P+ region 116b may be a region for maintaining the energy level of the well layer region 116a. For example, the P+ region 116b may be a region that allows the well layer region 116a to maintain a ground (ground level).

At least one of the well layer 116a, the P+ region 116b, and the N+ region 116c may be formed by ion implantation.

A gate layer 117 may be disposed on the gate oxide layer 112c. The gate layer 117 may be formed of polysilicon. The gate layer 117 may be connected to the gate electrode 117a (see FIG. 1) through another portion.

A source electrode 119 may be disposed on the gate layer 117. An interlayer dielectric layer 118 may be disposed between the gate layer 117 and the source electrode 119.

On the other hand, although not indicated by separate reference numerals, a second contact layer for facilitating contact between the P+ region 116b and the N+ region 116c may be disposed at both sides of the gate oxide layer 112. The second contact layer may be formed of nickel (Ni) silicide.

The current diffusion region may be located between the drift layer 114 and the gate oxide layer 112c when viewed in a vertical direction.

Figure 4:
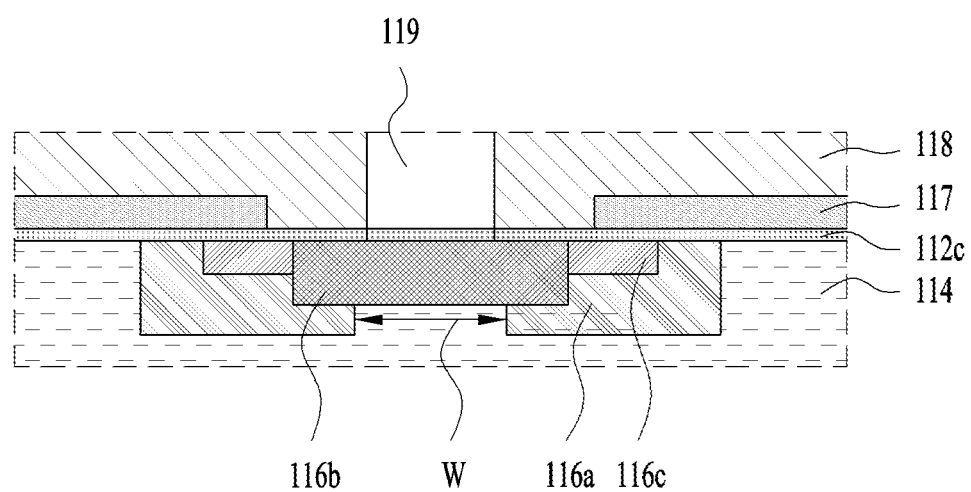
FIG. 4 is an enlarged view illustrating a first region of a metal-oxide semiconductor field effect transistor device according to an embodiment of the present disclosure.

FIG. 4 is an enlarged view illustrating the first region of a metal-oxide semiconductor field effect transistor (MOSFET) device according to an embodiment of the present disclosure.

FIG. 4 schematically shows a portion of the well layer region 116a formed between the unit elements 110a in FIG. 3. Accordingly, the shape of each region is simplified and displayed.

As described above, in the first region of the MOSFET device, the well layer regions 116a are not connected to each other in the portion between the unit elements 110a. That is, the P+ region 116b may be disposed between two well layer regions 116a in the portion between the unit elements 110a. In this way, the two well layer regions 116a may be separated from each other by the P+ region 116b in the portion between the unit elements 110a.

Here, a space between two well layer regions 116a in the portion between the unit elements 110a may be referred to as a PW window region indicating a region between P-well regions. In FIG. 4, the PW window region is denoted by W.

In a fabrication process of the MOSFET device, when a mask for forming the well layer regions 116a is designed, the PW window region (W) can be defined. Therefore, in an actual fabrication process of the MOSFET device, in the PW window region (W), ions are not implanted into the well layer region 116a, and the N+ region 116c is not naturally formed in the corresponding portion by the self-alignment process.

As such, when ion implantation for the P+ region 116b is performed in the PW window region (W) not including the N+ region 116c, an independent and segmented P+ contact that is not co-implanted with the N+ region 116c may be formed. Here, the expression "co-implantation" may refer to a phenomenon in which different carriers (i.e., N-type dopant and P-type dopant) are simultaneously implanted into the same region.

At this time, ion implantation is not performed in the PW window region (W) where the N+ region 116c is not formed, and the Schottky contact is made in the PW window region (W), so that the Schottky barrier diode (SBD) can be formed in the PW window region (W).

Figure 5:
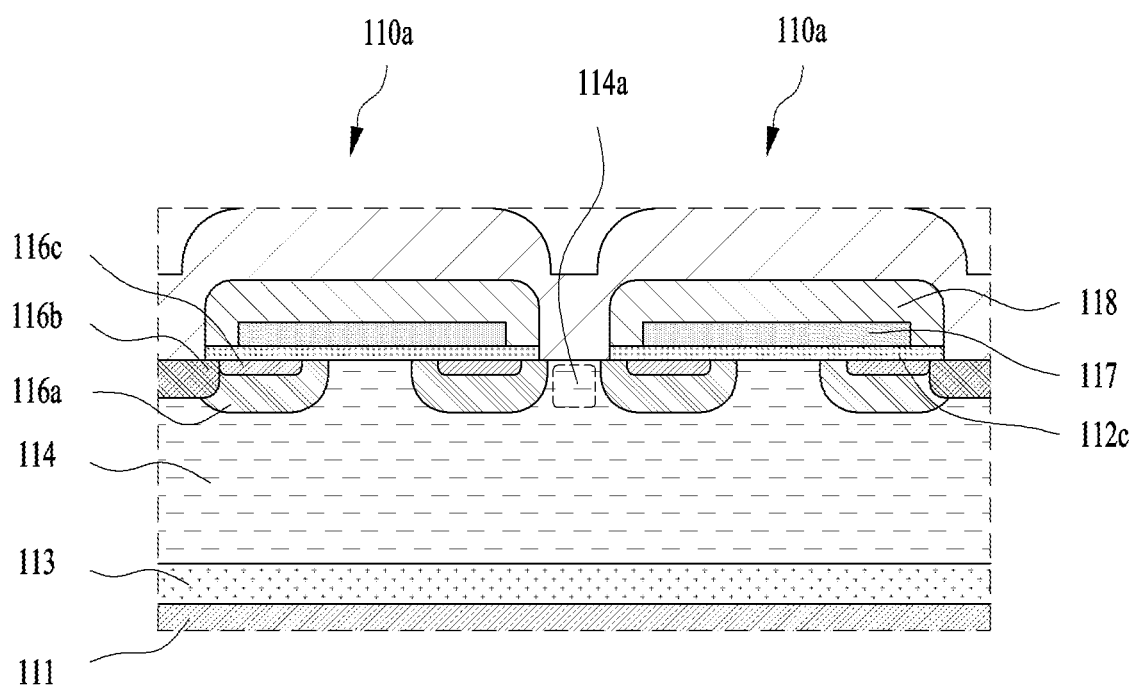
FIG. 5 is a cross-sectional view illustrating a portion taken along the line C-C' of FIG. 2.

FIG. 5 is a cross-sectional view illustrating the portion taken along the line C-C' of FIG. 2.

Hereinafter, the structure of the individual unit elements 110a will be briefly described with reference to FIG. 5. Here, a description of a portion overlapping with FIG. 3 will herein be omitted for brevity.

A drain electrode 111 may be disposed under the individual unit elements 110a. In addition, a source electrode 119 may be disposed at an upper side of the unit element 110.

A substrate 113 may be disposed on the drain electrode 111.

A drift layer 114 may be disposed on the substrate 113.

The P-type well layer regions (P-Wells) 116a formed to be spaced apart from each other at both sides of the unit element to form (or define) a channel may be disposed on the drift layer 114. A portion of the drift layer 114 disposed between the well layer regions 116a may be a current diffusion layer region.

As shown, the well layer regions 116a may be located symmetrically with respect to the current diffusion layer region located between the well layer regions 116a.

In addition, a gate oxide layer 112c may be disposed on the P-type well layer regions 116a. In this case, a channel may be formed between the P-type well layer regions 116a formed to be spaced apart from each other, and/or a channel may be formed in a portion where the P-type well layer regions 116a contact the gate oxide layer 112c.

On the other hand, the N+ region 116c neighboring the channel may be disposed on the well layer region 116a. The width of the N+ region 116c may be smaller than the width of each well layer region 116a.

Unlike the first region shown in FIG. 3, referring to FIG. 5, the P+ region 116b may not be disposed between the well layer regions 116a located between the unit elements 110a. As described above, the Schottky contact region 114a may be formed in a portion where the P+ region 116b is not formed between the well layer regions 116a disposed between the unit elements 110a.

The Schottky contact may be formed in the Schottky contact region 114a, resulting in formation of the Schottky barrier diode (SBD).

In FIG. 5, the well layer regions 116a may not be connected to each other in the portion between the unit elements 110a. That is, the Schottky contact region 114a may be disposed between two well layer regions 116a in the portion between the unit elements 110a. As described above, two well layer regions 116a may be disconnected from each other by the Schottky contact region 114a in the portion between the unit elements 110a.

On the well layer regions 116a, two N+ regions 116c may be disposed in the unit element 110a in a portion neighboring the channel region in a symmetrical direction with respect to the current diffusion layer region, and the P+ region 116*b* may be located outside the N+ region 116*c*.

At this time, the P+ region 116*b* may be thicker than the N+ region 116*c*. In addition, the P+ region 116*b* may be connected to the neighboring unit element 110*a*. In other words, the P+ region 116*b* may be located at a boundary between neighboring unit elements 110*a*. At this time, the P+ regions 116*b* may be alternately located at the boundary between neighboring unit elements 110*a*. That is, the P+ region 116*b* and the Schottky contact region 114*a* may be alternately located at the boundary between the neighboring unit elements 110*a*.

The P+ region 116*b* may be a region for maintaining the energy level of the well layer region 116*a*. For example, the P+ region 116*b* may be a region that allows the well layer region 116*a* to maintain a ground (ground level).

At least one of the well layer 116*a*, the P+ region 116*b*, and the N+ region 116*c* may be formed by ion implantation.

A gate layer 117 may be disposed on the gate oxide layer 112*c*. The gate layer 117 may be formed of polysilicon. The gate layer 117 may be connected to the gate electrode 117*a* (see FIG. 1) through another portion.

A source electrode 119 may be disposed on the gate layer 117. An interlayer dielectric layer 118 may be disposed between the gate layer 117 and the source electrode 119.

Figure 6:
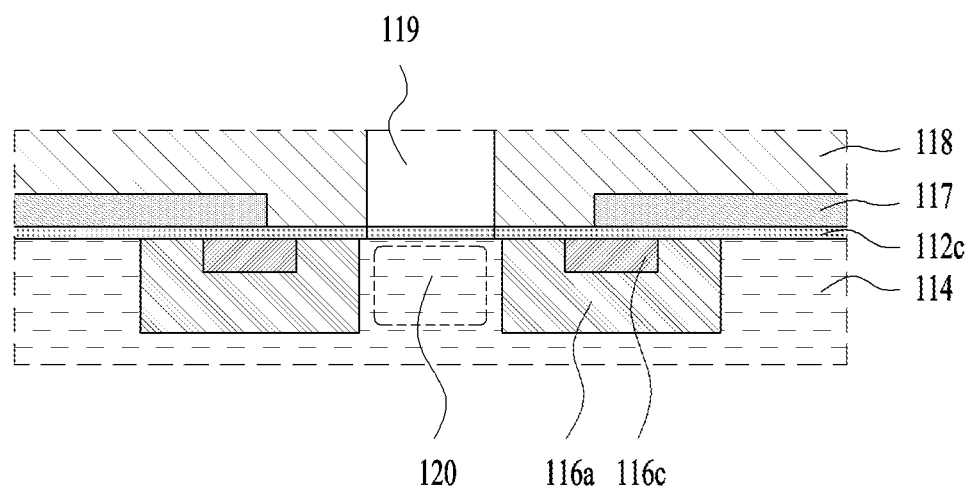
FIG. 6 is an enlarged view illustrating a second region of a metal-oxide semiconductor field effect transistor device according to an embodiment of the present disclosure.

FIG. 6 is an enlarged view illustrating a second region of a metal-oxide semiconductor field effect transistor (MOSFET) device according to an embodiment of the present disclosure.

FIG. 6 schematically shows a portion of the well layer region 116*a* formed between the unit elements 110*a* in FIG. 5. Accordingly, the shape of each region is simplified and displayed.

As described above, in the second region of the MOSFET device, the well layer regions 116*a* are not connected to each other in the portion between the unit elements 110*a*. That is, the Schottky contact region 114*a* may be disposed between two well layer regions 116*a* in the portion between the unit elements 110*a*. In this way, the two well layer regions 116*a* may be separated from each other by the Schottky contact region 114*a* in the portion between the unit elements 110*a*.

In the second region, a space between two well layer regions 116*a* in the portion between the unit elements 110*a* may be referred to as a PW window region indicating a region between P-well regions. In FIG. 6, since the Schottky contact region 114*a* is located in the PW window region, it is not separately indicated.

In a fabrication process of the MOSFET device, when a mask for forming the well layer regions 116*a* is designed, the PW window region (W) can be defined. Therefore, in an actual fabrication process of the MOSFET device, in the PW window region (W), ions are not implanted into the well layer region 116*a*, and the N+ region 116*c* is not naturally formed in the corresponding portion by the self-alignment process.

As such, ion implantation is performed in the PW window region (W) not including the N+ region 116*c*, and the Schottky contact is performed in the PW window region (W), resulting in formation of the Schottky barrier diode (SBD). That is, the Schottky contact region 114*a* may form a portion of the Schottky barrier diode (SBD).

Figure 7:
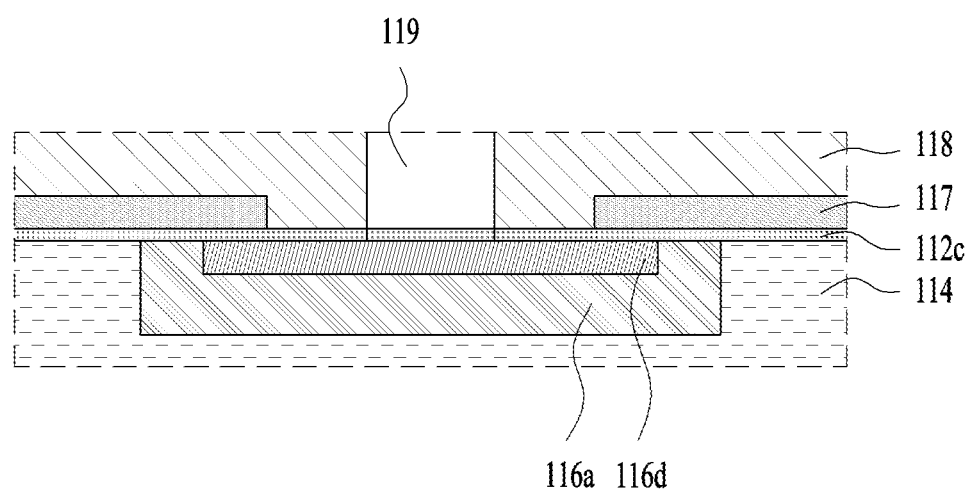
FIG. 7 is a cross-sectional view illustrating a portion taken along the B-B' of FIG. 2.

FIG. 7 is a cross-sectional view illustrating a portion taken along the B-B' of FIG. 2.

FIG. 7 schematically shows a portion of the well layer region 116*a* formed between the unit elements 110*a*. Accordingly, the shape of each region is simplified and displayed.

As described above, the well layer regions 116*a* may be connected to each other in a portion between the unit elements 110*a* at the region disposed between the first region and the second region.

In addition, the N+ regions 116*d* may be connected to each other in a portion between the unit elements 110*a* at the region disposed between the first region and the second region.

Figure 8:
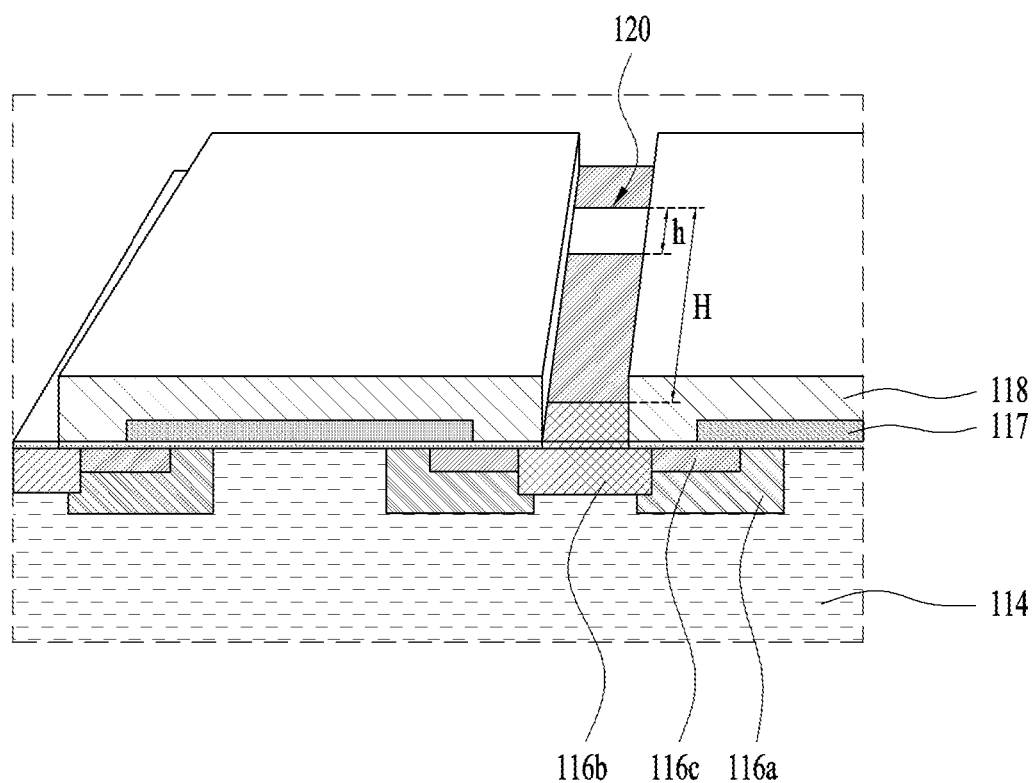
FIG. 8 is a perspective view illustrating a metal-oxide semiconductor field effect transistor device according to an embodiment of the present disclosure.
Figure 9:
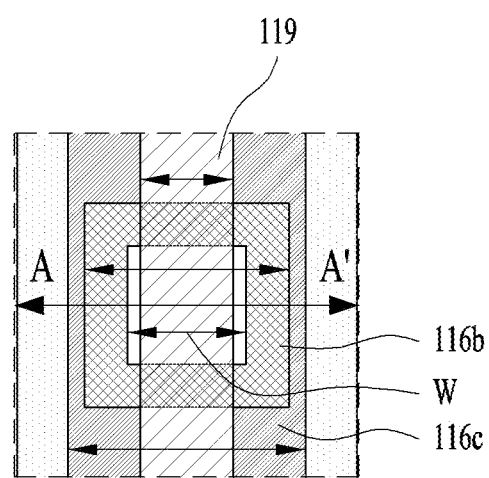
FIG. 9 is an enlarged view illustrating a portion of a PW window of a metal-oxide semiconductor field effect transistor device according to an embodiment of the present disclosure.

FIG. 8 is a perspective view illustrating a metal-oxide semiconductor field effect transistor (MOSFET) device according to an embodiment of the present disclosure. FIG. 9 is an enlarged view illustrating a portion of the PW window of a metal-oxide semiconductor field effect transistor (MOSFET) device according to an embodiment of the present disclosure.

In FIG. 8, a first region and a second region are shown together in order to facilitate understanding of the present disclosure. That is, the cross-sectional region where the P+ region 116*b* is located between two well layer regions 116*a* may refer to the first region, and the region where the Schottky contact region 114*a* is located may refer to the second region.

Unlike the MOSFET structure in which a conventional discontinuous P+ contact is formed, the MOSFET structure proposed in the present disclosure may include a PW window region present between the well layer regions 116*a* of the region where the P+ contact is formed.

At this time, the P+ region 116*b* may overlap the well layer region 116*a* by a predetermined length with respect to the PW window region.

Referring to FIG. 8, the P+ region 116*b* may be partially continuously located in the vertical direction of the device (e.g., the longitudinal direction of the P+ region 116*b*). At this time, if the length of one repeated unit element is set to 1, the length of the P+ region 116*b* can be adjusted to a length between 0 and 1 according to the purpose or details of the fabricated MOSFET device. At this time, the width of the PW window of the MOSFET device can also be determined according to the designed length of the P+ region 116*b*.

In FIG. 8, the length of the P+ region 116*b* is denoted by H, and the length of the Schottky contact region 114*a* is denoted by 'h'. As described above, the Schottky contact region 114*a* may be naturally formed in a region where the P+ region 116*b* is not located.

Referring to FIG. 9, the Schottky contact region 114*a* may be naturally formed when the P+ region 116*b* is not formed according to the selection in the PW window region (W) where the P+ region 116*b* is formed.

Figure 10:
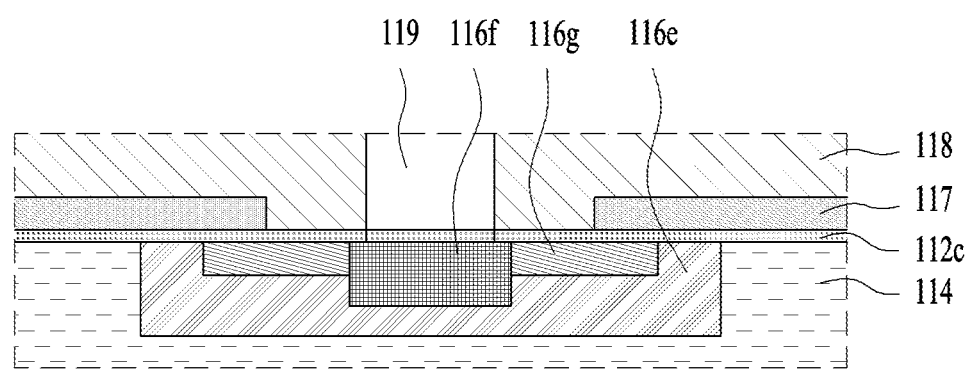
FIG. 10 is an enlarged cross-sectional view illustrating a portion of a conventional metal-oxide semiconductor field effect transistor device serving as a comparative example.

FIG. 10 is an enlarged cross-sectional view illustrating a portion of a conventional metal-oxide semiconductor field effect transistor (MOSFET) device serving as a comparative example.

FIG. 10 is a cross-sectional view of the portion corresponding to FIGS. 4 and 6, and is a cross-sectional of a conventional MOSFET device.

That is, FIG. 10 schematically shows a portion of the well layer region 116*e* in a portion between the unit elements 110*a* of a conventional MOSFET device. Accordingly, the shape of each region is simplified and displayed.

The well layer regions 116*e* may be entirely connected to each other in the portion between the unit elements 110*a*.

At this time, two N+ regions 116*g* may be disposed on the well layer region 116*e*. In addition, the P+ region 116*f* may be disposed between the two N+ regions 116*g*.

A source electrode 119 may be disposed on the P+ region 116f, and thus the P+ region 116f may serve as a contact region.

A PN diode may exist in the basic structure of a conventional power MOSFET. Since the PN diode has poor reverse conductivity, the Schottky barrier diode (SBD) is integrally formed in the MOSFET device to solve such poor reverse conductivity.

However, in a conventional MOSFET device, a cell pitch may increase due to the integrated Schottky barrier diode (SBD), thereby causing a problem in which RonA increases. Here, RonA may represent ON resistance per unit area, and may be a parameter indicating a loss during conduction of the MOSFET device.

In addition, since the P+ region 116f is formed on the N+ region 116g, it may be impossible to stably maintain the electrical level of the well layer region 116e serving as a contact of the P+ region 116f. Also, as mentioned above, the overall power conversion efficiency may decrease as reverse conductivity indicating resistance of the MOSFET device is deteriorated in the reverse operation.

However, whereas the conventional MOSFET device has disadvantages in that performance is deteriorated and an additional mask layer should be used, the MOSFET device proposed in the present disclosure further includes the Schottky barrier diode (SBD) without increasing RonA, thereby increasing reverse conductivity.

Figure 11:
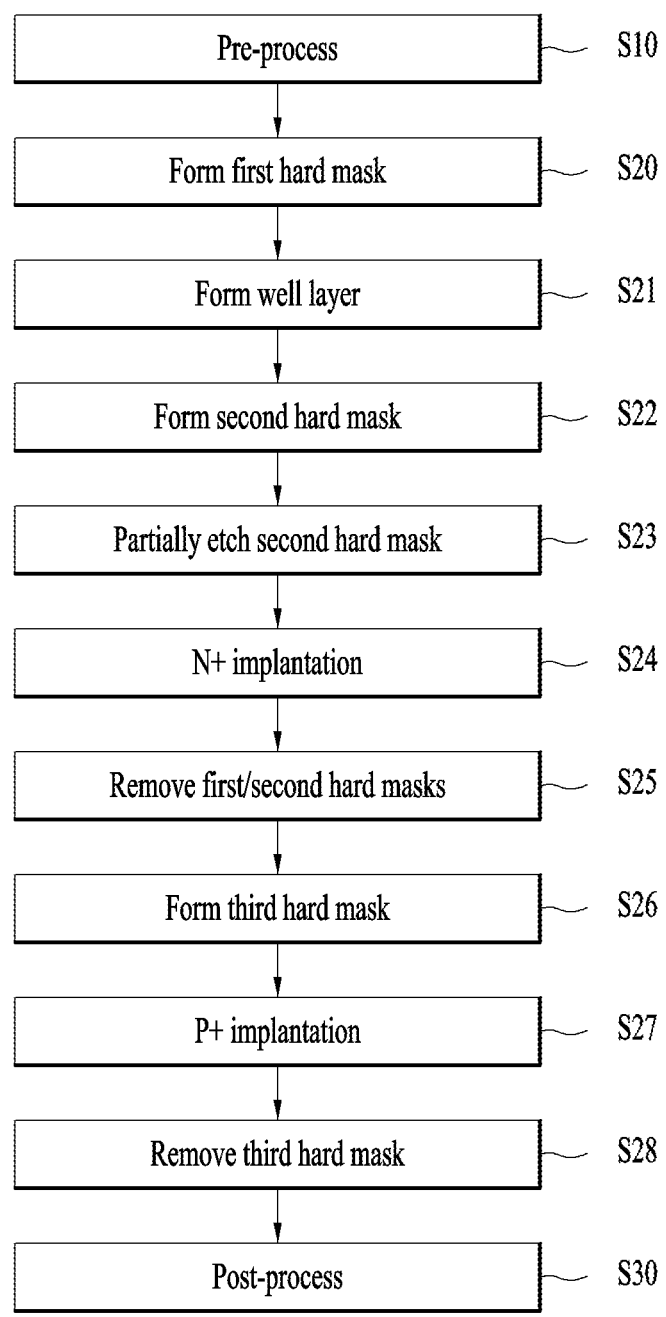
FIG. 11 is a flowchart illustrating a method for manufacturing a metal-oxide semiconductor field effect transistor device according to an embodiment of the present disclosure.

FIG. 11 is a flowchart illustrating a method for manufacturing the metal-oxide semiconductor field effect transistor (MOSFET) device according to an embodiment of the present disclosure. FIGS. 12 to 19 are cross-sectional views illustrating steps included in a method for manufacturing the metal-oxide semiconductor field effect transistor (MOSFET) device according to an embodiment of the present disclosure.

Hereinafter, a method for manufacturing the MOSFET device according to an embodiment of the present disclosure will be described in detail with reference to FIG. 11 and related cross-sectional views.

Referring to FIG. 11, a pre-process may be performed (S10). Here, the pre-process may refer to processes prior to forming the first mask 131. For example, the pre-process may refer to a process for forming the drift layer 114 on the substrate 113. In the drawings from FIG. 12, the drain electrode 111 is disposed under the substrate 113, but the drain electrode 111 may be formed later. That is, the process of forming the drain electrode 111 may correspond to a post-process S30.

Figure 12:
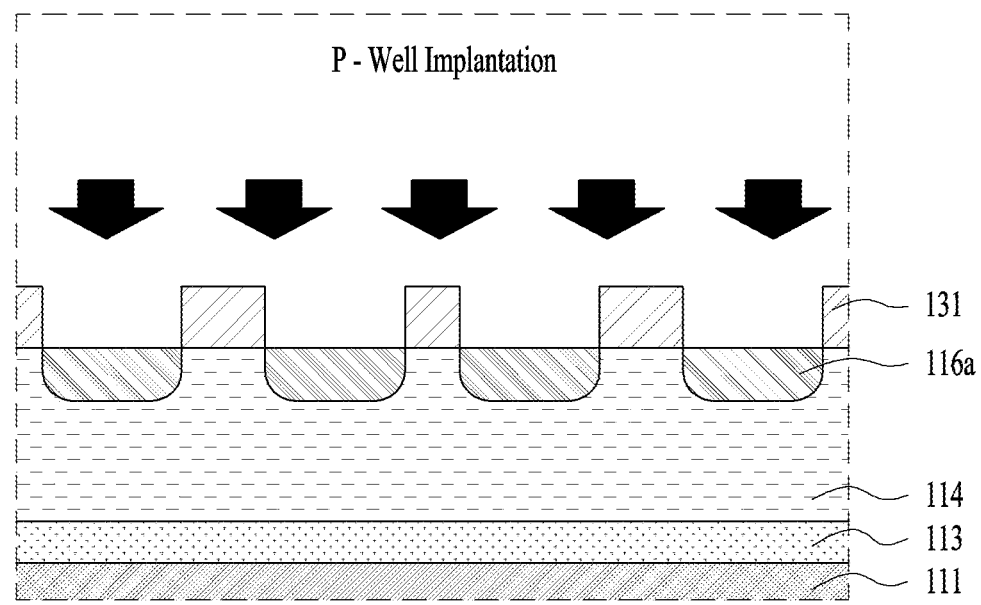
FIGS. 12 to 19 are cross-sectional views illustrating steps included in a method for manufacturing a metal-oxide semiconductor field effect transistor device according to an embodiment of the present disclosure.

Thereafter, referring to FIG. 12, a first mask 131 may be formed on the drift layer 114 (S20). That is, the first mask 131 for forming a plurality of arranged well layer regions may be formed on the drift layer 114.

The first mask 131 may be a mask for dry etching. Such a mask may be referred to as a hard mask. In addition, the hard mask may be gradually removed as the dry etching process proceeds.

As illustrated, the first mask 131 may be formed on the drift layer 114 to have a predetermined pattern. For example, mask regions having different widths (e.g., a first width and a second width) may be alternately formed along the surface of the drift layer 114, resulting in formation of the first mask 131. In this case, a relatively small width of the first mask 131 may correspond to a region between the unit elements. In addition, the widths between the individual mask regions may be equal to each other.

A plurality of well layer regions 116a may be formed using the first mask 131 (S21). That is, the well layer regions 116a may be formed by ion implantation (i.e., P-well implantation) using the first mask 131.

At this time, the well layer regions 116a having the same width may be formed according to the arrangement of the first mask 131. In addition, the widths between the well layer regions 116a may not be the same. That is, as described above, the widths between the well layer regions 116a may be implemented by alternately arranging the first width and the second width.

One of the first width and the second width between the well layer regions 116a may correspond to the PW window region (W). Therefore, the pitch of the first mask 131 may be approximately half that of the case in which the PW window region (W) is not formed.

Figure 13:
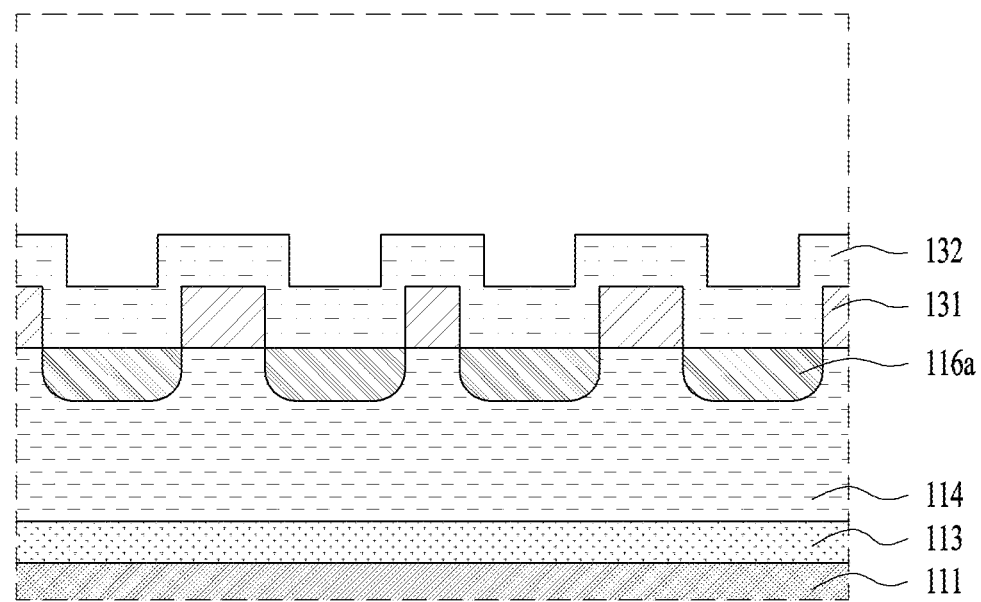

Subsequently, referring to FIG. 13, a second mask 132 may be formed on the first mask 131 and the formed well layer region 116a (S22).

The second mask 132 may be continuously formed on the first mask 131 and the well layer region 116a. Since the first mask 131 has a different height from the well layer region 116a, the second mask 132 may also have different heights.

The second mask 132 may also be a mask for dry etching. That is, the second mask 132 may be a hard mask.

Figure 14:
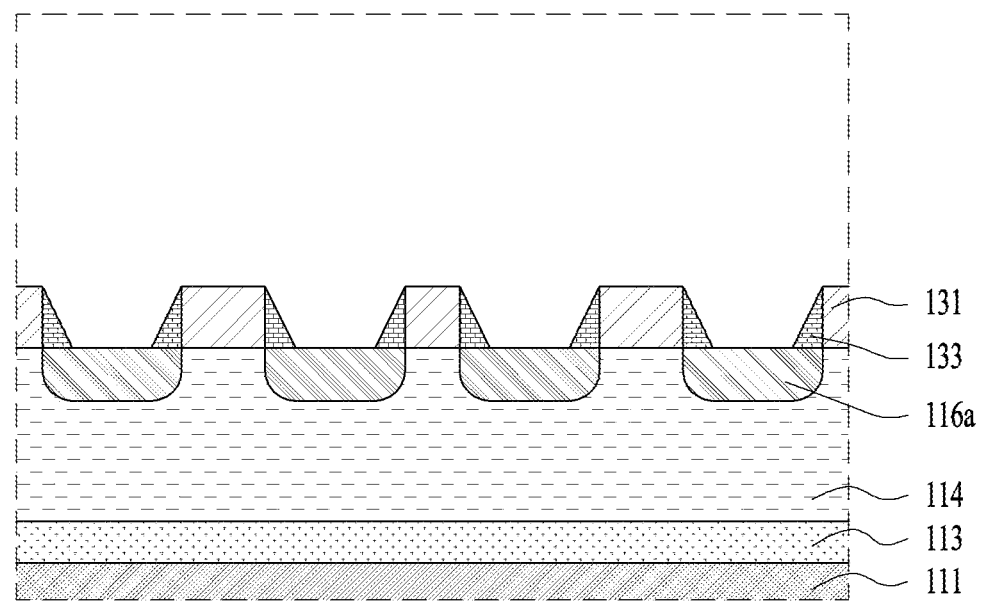

Thereafter, as shown in FIG. 14, the second mask 132 may be selectively removed. For example, the second mask 132 may be partially removed by etching (S23).

As such, the partially removed second mask 132 may be partially disposed on a side surface of the first mask 131. For example, the partially removed second mask 132 may be located as a tilt mask 133 having a slope on the side surface of the first mask 131. The tilt mask 133 may partially cover both sides of each well layer region 116a.

Since the tilt mask 133 is a mask that is naturally formed during the fabrication process, a separate alignment process is not required. Accordingly, the process for forming the tilt mask 133 may be referred to as a self-alignment process. In addition, the tilt mask 133 may have an accurate positional relationship according to the design.

In a fabrication process of the MOSFET device, an alignment error is not allowed between the well layer region 116a and the N+ region 116c. Therefore, this self-alignment process can be used.

Figure 15:
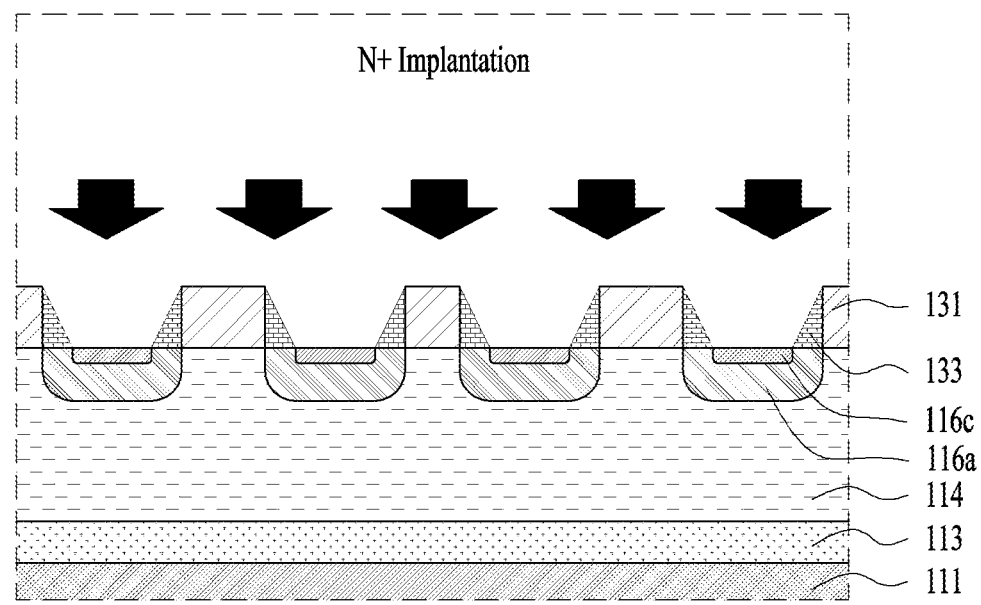

Referring to FIG. 15, the N+ region 116c may be formed on the well layer region 116a using the tilt mask 133 (serving as a portion of the second mask 132) as a mask (S24). Thus, the width of the N+ region 116c may be smaller than the width of the well layer region 116a.

In addition, the N+ region 116c may be formed by ion implantation.

Figure 16:
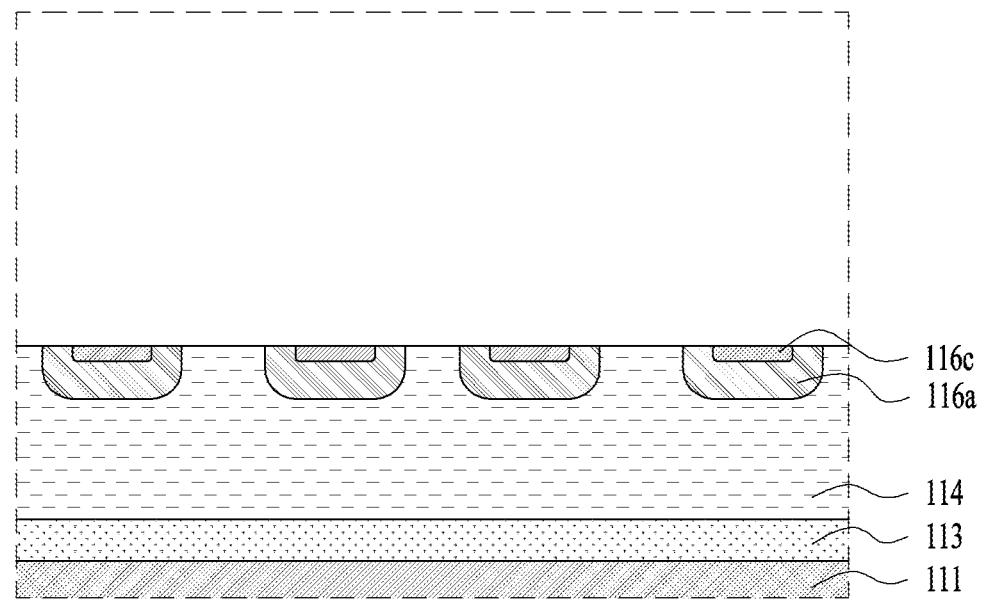

Thereafter, as shown in FIG. 16, the first mask 131 and the second mask 132 may be removed (S25). Here, the second mask 132 may refer to a mask including the tilt mask 133.

Figure 17:
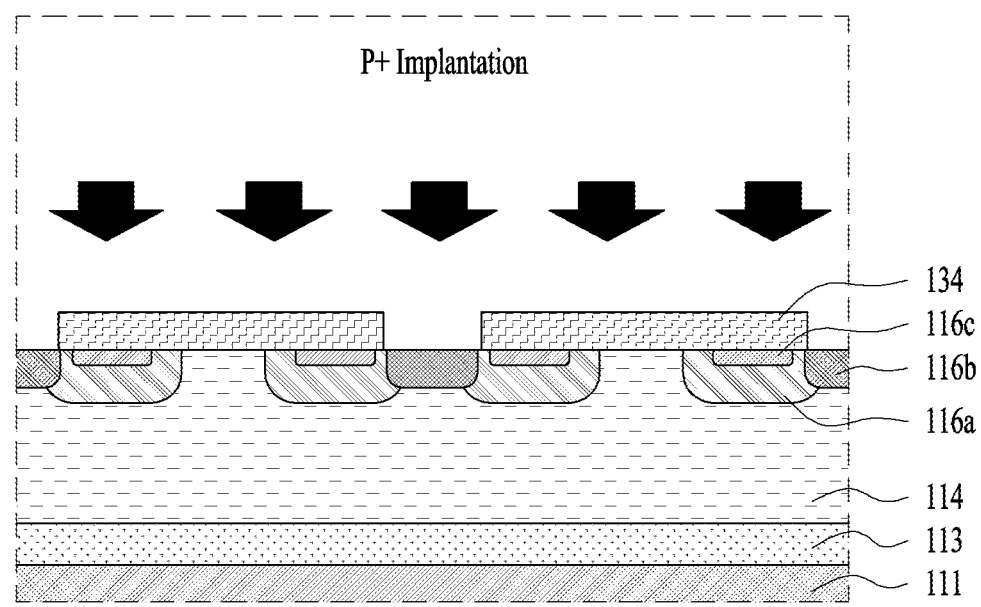

Referring to FIG. 17, a third mask 134 may be formed to cover the N+ regions 116c adjacent to each other (S26). Here, the third mask 134 may selectively cover the two neighboring N+ regions 116c. Accordingly, the third mask 134 may open a connection portion of the unit element.

Thereafter, the P+ region 116b may be formed using the third mask 134 (S27). The P+ region 116b may be formed by ion implantation.

The P+ region 116b may be formed at a connection part of the unit element. As such, the P+ region 116b may be formed between two well layer regions 116a separated from each other.

Meanwhile, as described above, the process S27 for forming the P+ region 116b using the third mask 134 may be performed in the first region of the MOSFET device.

In addition, the Schottky contact region may be formed in the second region spaced apart from the first region. The Schottky contact region may be formed naturally by not forming the P+ region 116b in the second region.

As described above with reference to FIG. 2, the first region may refer to the inside of the P+ region 116b of the portion taken along the line A-A'. In addition, the second region may refer to the inside of the well layer region 116a of the portion taken along the line the line C-C', or may refer to a region between the well layer regions 116a.

Thus, the second region may include the Schottky contact region. Specifically, if the P+ region 116b is not formed in the second region, the Schottky contact region 114a (see FIG. 4 and FIG. 5) may be naturally formed. The second region including the Schottky contact region 114a may operate as a Schottky barrier diode (SBD).

The first region and the second region may be spaced apart from each other in the longitudinal direction of the source electrode 119.

In addition, the width between two neighboring well layer regions 116a in the first region may be substantially the same as the width between two neighboring well layer regions 116a in the second region.

As described above, at least one of the first region and the second region may be repeatedly arranged in a direction perpendicular to the arrangement direction of the well layer regions 116a.

Figure 18:
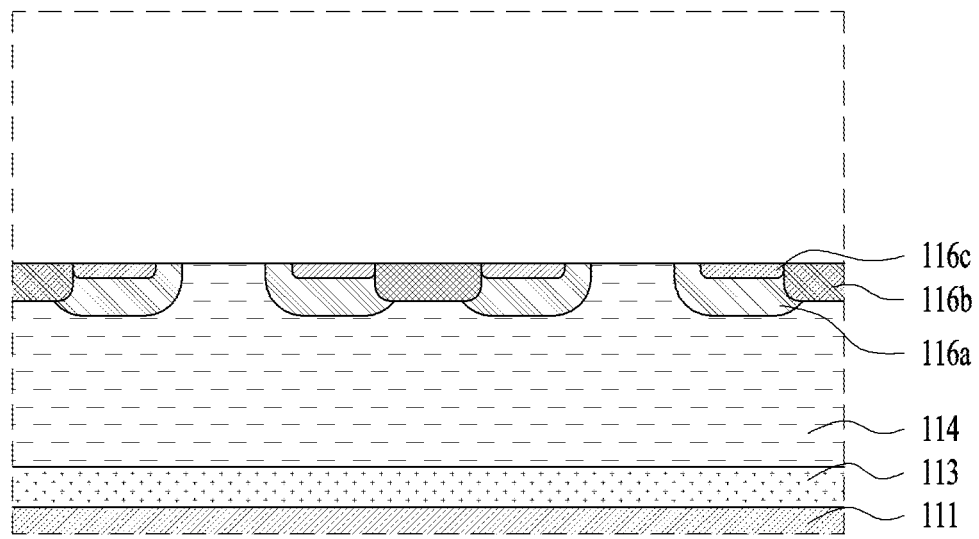

Referring to FIG. 18, the third mask 134 may then be removed (S28).

Thereafter, a post-process may be performed (S30). The post-process may include forming the gate oxide layer 112c, forming the gate layer 117, forming the interlayer dielectric layer 118, and forming the source electrode 119.

Figure 19:
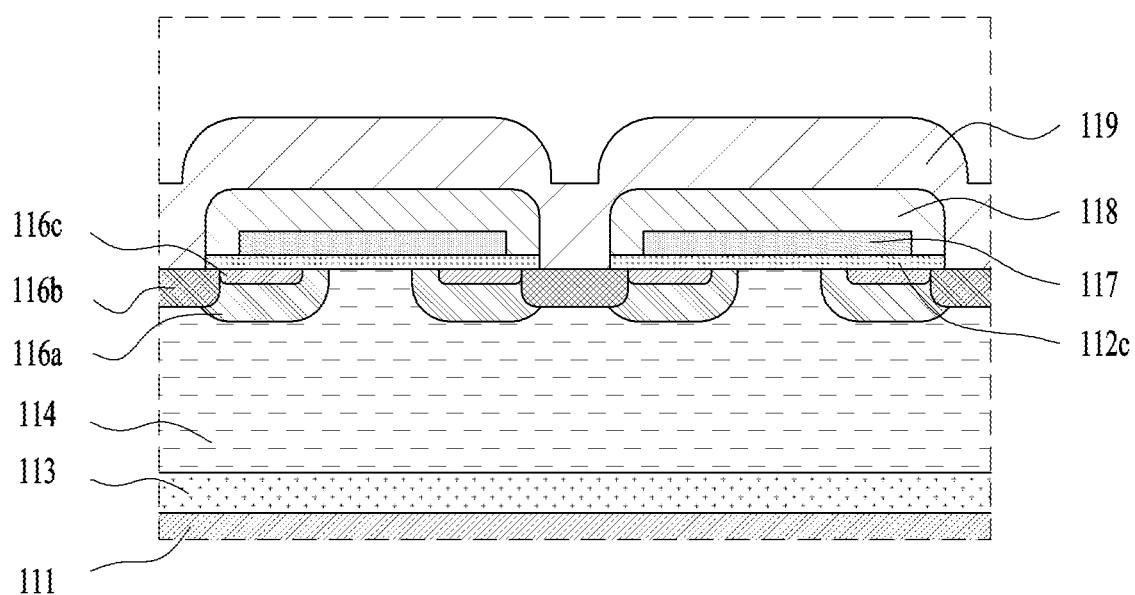

In this way, when the post-process is performed, the MOSFET device as shown in FIG. 19 can be manufactured. As described above, FIG. 19 shows the first region.

In addition, the post-process may further include at least one of forming the gate electrode 117a, and forming the drain electrode 111.

FIGS. 20 to 28 are cross-sectional views illustrating methods for manufacturing a conventional metal-oxide semiconductor field effect transistor (MOSFET) device serving as a comparative example.

Hereinafter, a method for manufacturing the conventional MOSFET device will be briefly described with reference to FIGS. 20 to 28.

Figure 20:
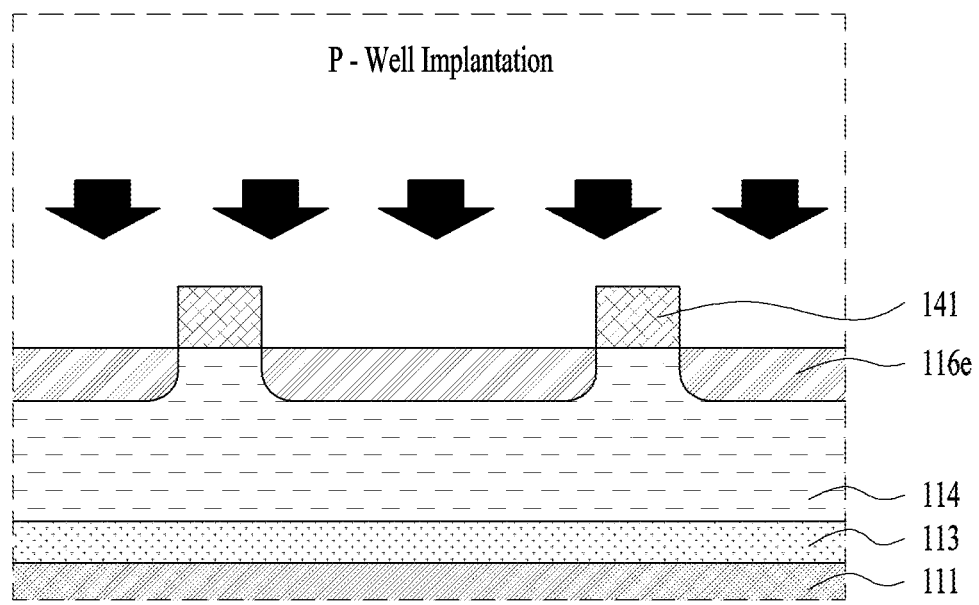
FIGS. 20 to 28 are cross-sectional views illustrating methods for manufacturing a conventional metal-oxide semiconductor field effect transistor device serving as a comparative example.

Referring to FIG. 20, a first mask 141 may be formed on the drift layer 114. That is, the first mask 141 for forming a plurality of arranged well layer regions may be formed on the drift layer 114.

As shown, the first mask 141 may be formed on the drift layer 114 to have a predetermined pattern. In this case, the first masks 141 may be arranged at regular intervals with a predetermined width in the entire region.

According to this comparative example, it can be seen that the first masks 141 are arranged at a wider interval than the first masks 131 shown in FIG. 12.

A plurality of well layer regions 116e may be formed using the first mask 141.

Figure 21:
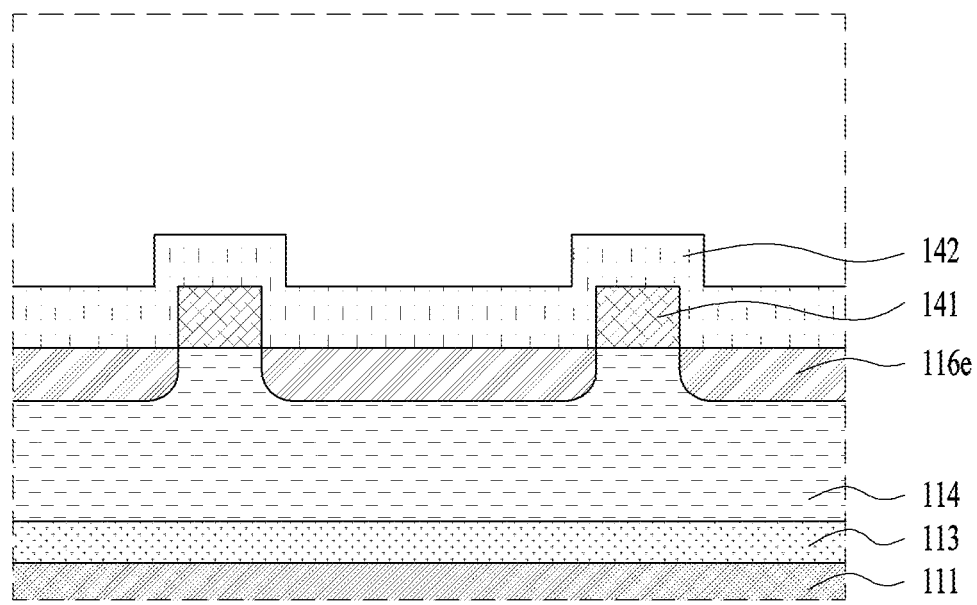

Referring to FIG. 21, the second mask 142 may be formed on the first mask 141 and the formed well layer regions 116e.

The second mask 142 may be continuously disposed on the first mask 141 and the well layer region 116e.

Figure 22:
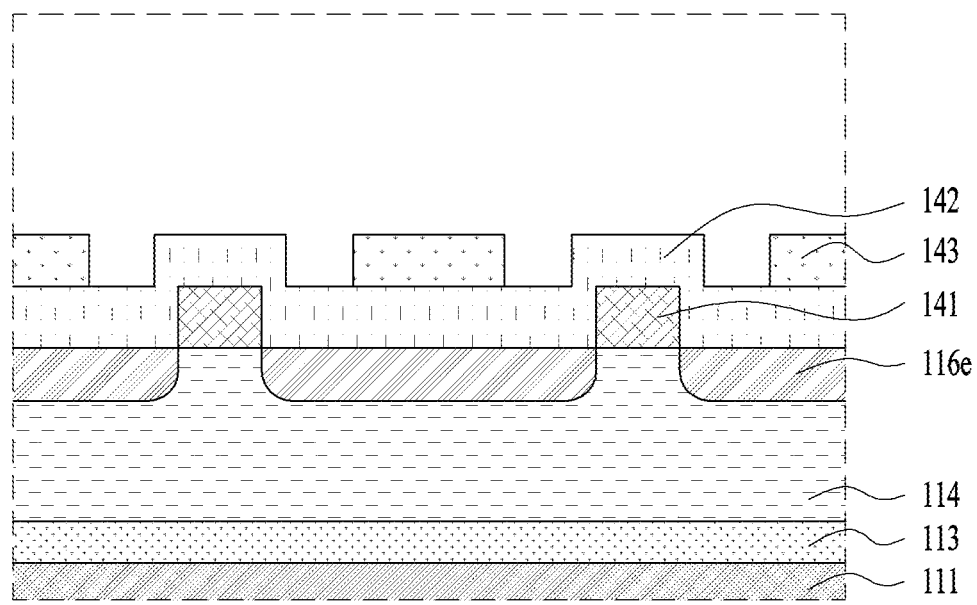

Thereafter, as shown in FIG. 22, a photoresist 143 may be formed on the second mask 142. The photoresist 143 may act as a soft mask. In addition, the photoresist 143 may be formed in a portion between the first masks 141.

Figure 23:
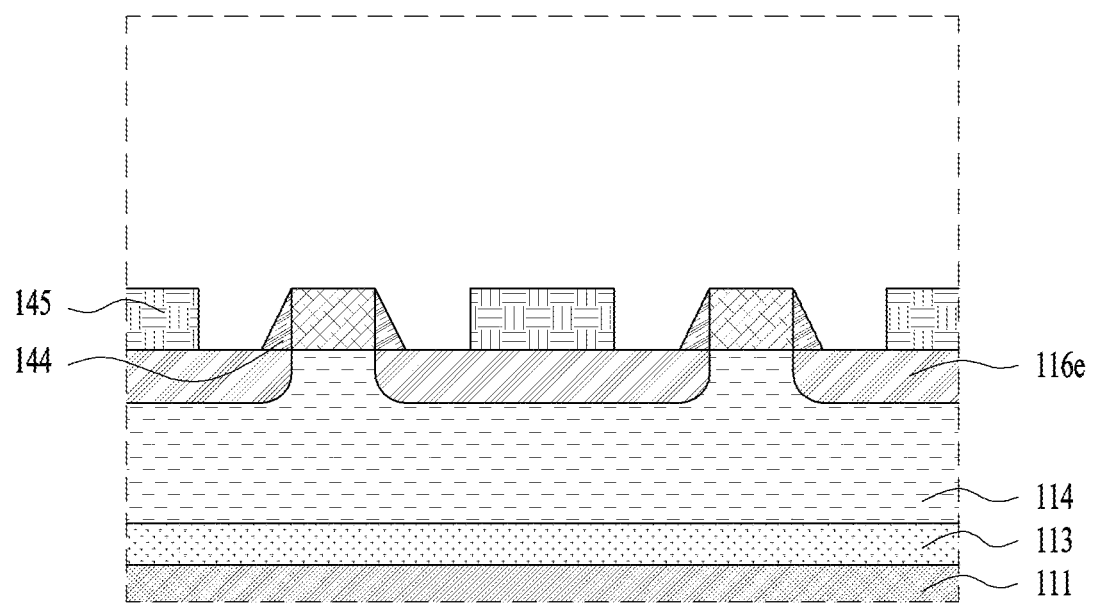

When etching is performed in a state where the second mask 142 and the photoresist 143 are positioned, a cross-sectional view as shown in FIG. 23 can be obtained.

Referring to FIG. 23, the second mask 142 may be selectively removed.

As such, the partially removed second mask 142 may be partially disposed on a side surface of the first mask 141. For example, the partially removed second mask 142 may be located as a tilt mask 144 having a slope on the side surface of the first mask 141.

In addition, the second mask 142 may remain as the intermediate mask 145 in a region where the photoresist 143 was positioned.

Figure 24:
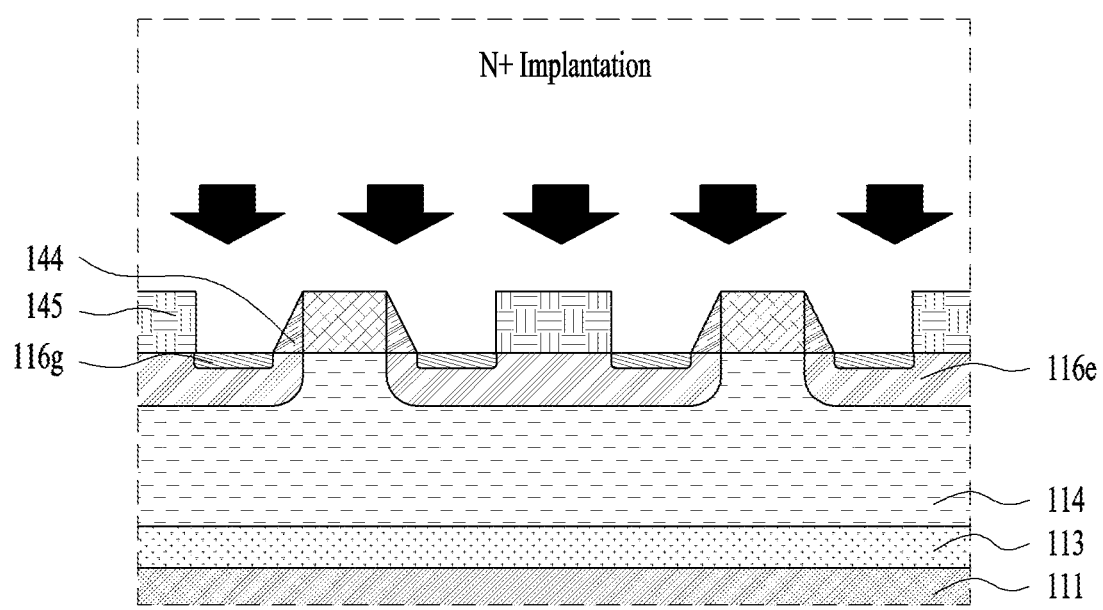

Referring to FIG. 24, the N+ region 116g may be formed on the well layer region 116e using the tilt mask 144 and the intermediate mask 145 as a mask.

In this case, two N+ regions 116g may be formed on one well layer region 116e.

Figure 25:
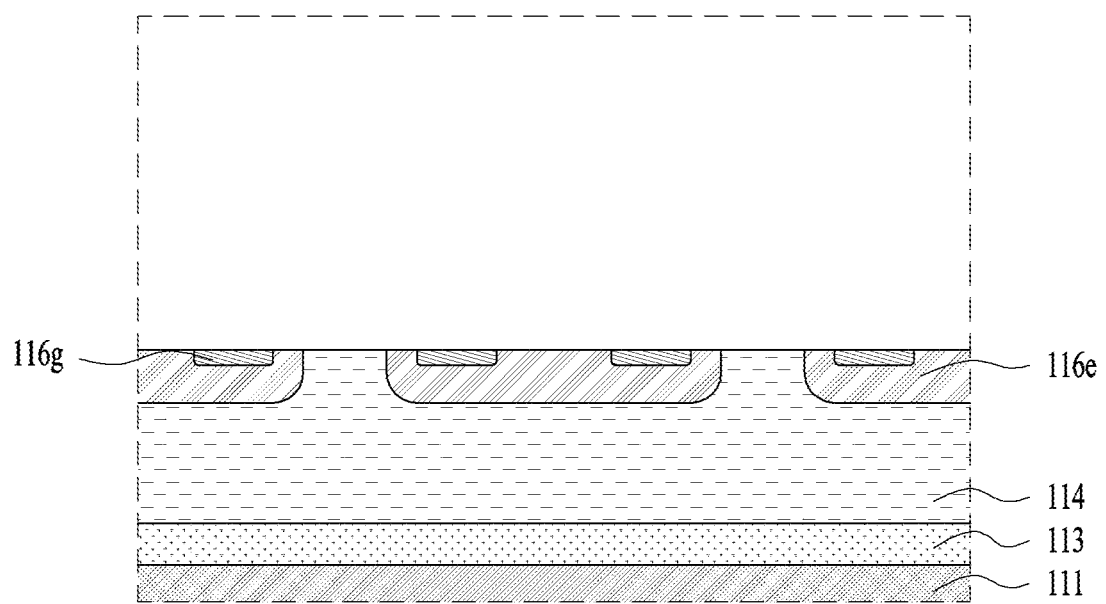

Thereafter, as shown in FIG. 25, the first mask 131 and the second mask 132 may be removed.

Figure 26:
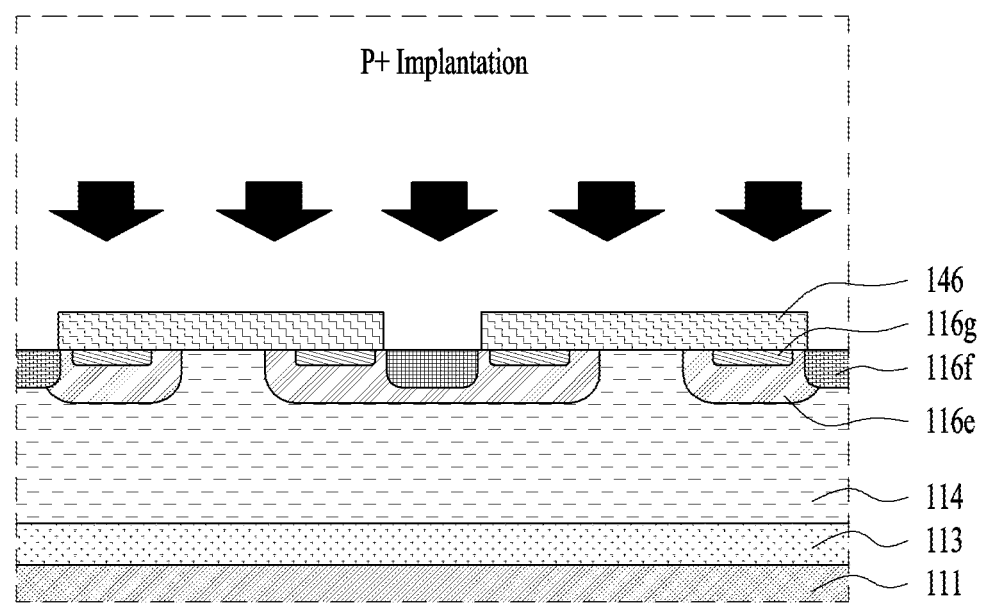

Referring to FIG. 26, a third mask 146 covering the N+ regions 116g adjacent to each other may be formed. Here, the third mask 146 may selectively cover two N+ regions 116g adjacent to each other. Accordingly, the third mask 146 may open a connection portion of the unit element.

Thereafter, the P+ region 116f may be formed using the third mask 146.

The P+ region 116f may be formed at a connection portion of the entire unit element.

Figure 27:
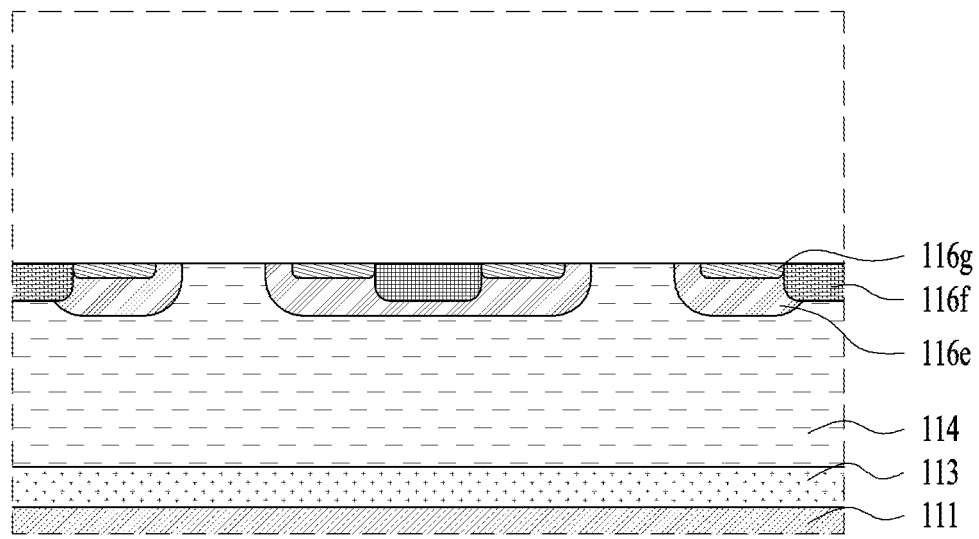
Figure 28:
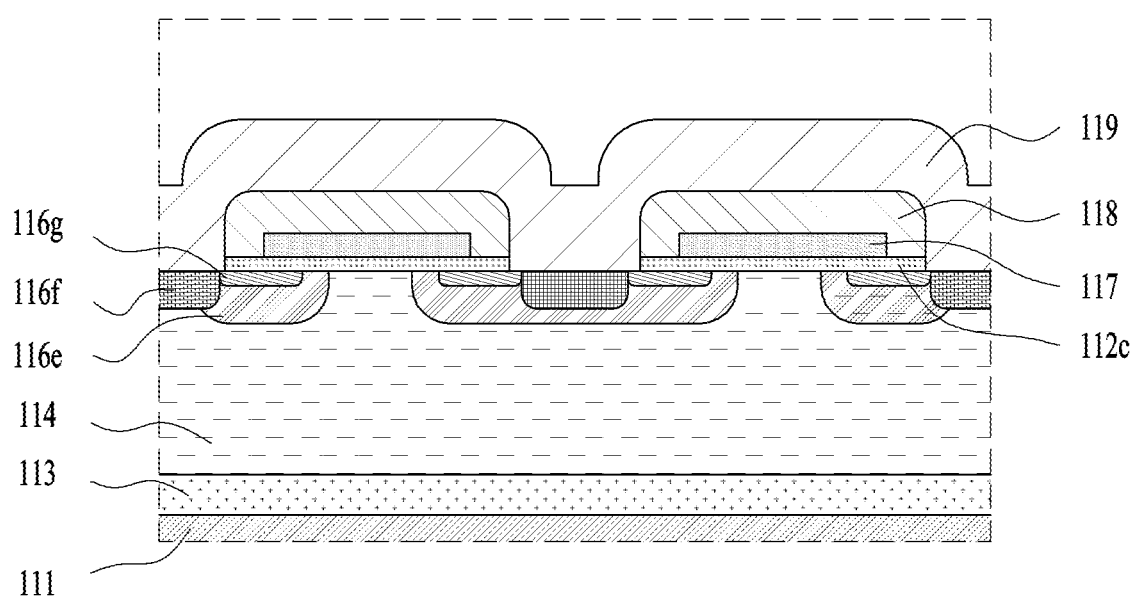

Referring to FIG. 27, the third mask 146 may then be removed.

Thereafter, a post-process may be performed. The post-process may include forming the gate oxide layer 112c, forming the gate layer 117, forming the interlayer dielectric layer 118, and forming the source electrode 119.

The above-described self-alignment process used in the process of manufacturing the MOSFET device has advantages such as reduction in the number of mask layers, prevention of channel misalignment, etc.

However, in this process, according to a general manufacturing process, performance of the MOSFET device may deteriorate as the N+ region 116g and the P+ region 116f are simultaneously implanted (co-implantation).

In order to prevent such a phenomenon, a mask layer may be additionally used, or a new ion implantation process condition or an etching process development is required.

In addition, an increase in production costs caused by addition of such unnecessary processes may act as a disadvantage of weakening the market competitiveness of the manufactured devices.

In the process of manufacturing the conventional MOSFET device described with reference to FIGS. 20 to 28, when an additional mask, such as a photoresist 143 or an intermediate mask 145, is used, the P+ region 116f may be independently formed in an intermediate portion where the N+ region 116g is not formed.

However, if such an additional mask is not used, performance of the MOSFET device may deteriorate as the P+ region 116f is formed in a portion where the N+ region 116g was formed (so-called co-implantation).

That is, in order to independently form the P+ region 116f in the self-alignment process, the use of an additional mask is essential.

In addition, characteristics of the MOSFET device may have the following problems.

That is, as there occurs co-implantation in which the P+ region 116f is formed in the portion where the N+ region 116g was formed, it may be impossible to stably form the electrical level of the well layer region 116e acting as the P+ region 116f.

In addition, as reverse conductivity characteristics indicating resistance of the MOSFET device during the reverse operation deteriorate, the power conversion efficiency may decrease.

However, the MOSFET device and the method for manufacturing the same according to an embodiment of the present disclosure can solve the above problems.

As described above, the MOSFET device proposed in the present disclosure does not deteriorate performance without using the additional mask layer, and further includes the Schottky barrier diode (SBD) without increasing RonA, so that reverse conductivity can be improved.

That is, according to the present disclosure, so-called co-implantation, which means that the P+ region 116f is formed in the portion where the N+ region 116g was formed, is prevented without the use of an additional mask, so that deterioration of contact performance of the MOSFET device can be prevented.

In addition, according to the present disclosure, the Schottky barrier diode (SBD) can be integrated in the MOSFET device without increasing the pitch of the unit element, so that the MOSFET device can improve reverse conductivity without increasing RonA.

Figure 29:
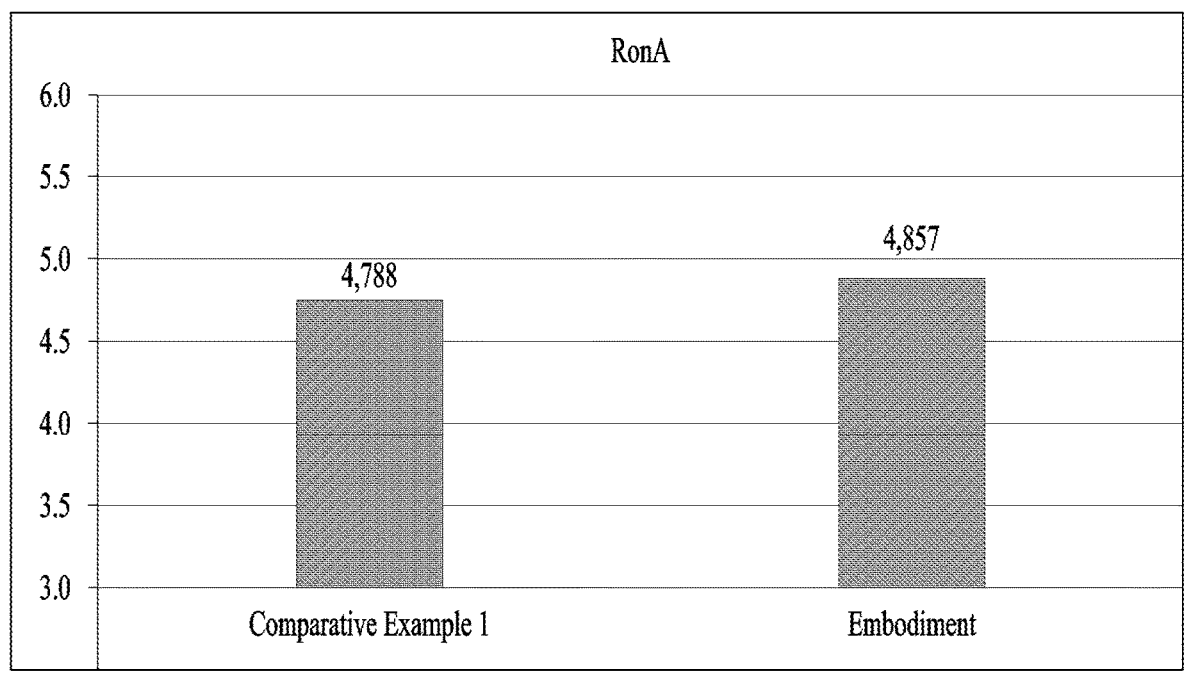
FIG. 29 is a graph illustrating characteristics of a MOSFET device according to a comparative example and characteristics of a MOSFET device according to an embodiment of the present disclosure.
Figure 30:
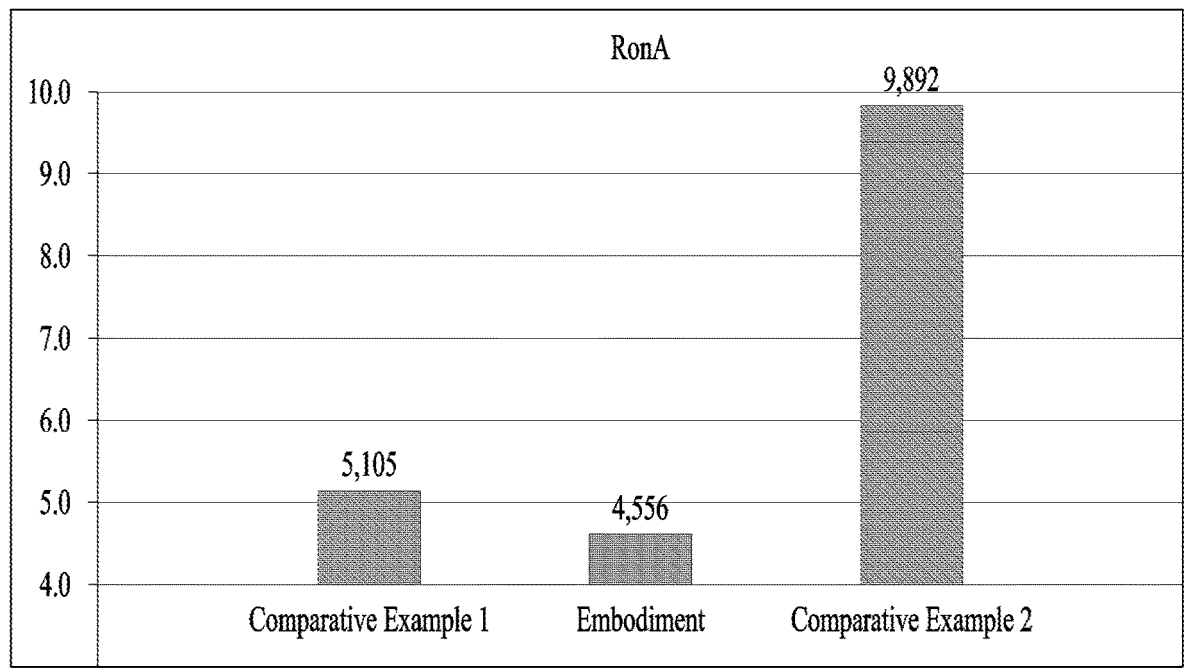
FIG. 30 is a graph illustrating examples of reverse conductivity obtained when an additional mask is not used in a process of manufacturing a MOSFET device according to comparative examples and an embodiment of the present disclosure.

FIG. 29 is a graph illustrating characteristics of a MOSFET device according to a comparative example and characteristics of a MOSFET device according to an embodiment of the present disclosure. FIG. 30 is a graph illustrating examples of reverse conductivity obtained when an additional mask is not used in a process of manufacturing a MOSFET device according to comparative examples and an embodiment of the present disclosure.

FIG. 29 shows the characteristics of the MOSFET device according to the above-described comparative example (Comparative Example 1: the case of using an additional mask).

Referring to FIG. 29, it can be seen that there is no significant difference in characteristics between Comparative Example 1 and the Embodiment of the present disclosure because the additional mask is used in Comparative Example 1. That is, it can be confirmed that there is no significant difference in RonA between Comparative Example 1 and Embodiment of the present disclosure.

FIG. 30 shows reverse conductivity characteristics of the MOSFET device according to Comparative Example 1 (in which the additional mask is used), Comparative Example 2 (in which the additional mask is not used), and Embodiment of the present disclosure.

As shown in the drawings, it can be seen that reverse conductivity characteristics of the MOSFET device according to the embodiment of the present disclosure are slightly improved even though the additional mask is used in Comparative Example 1.

In addition, it can be seen that reverse conductivity characteristics are greatly reduced in Comparative Example 2 in which the additional mask is not used.

As described above, it can be confirmed that the MOSFET device according to the embodiment of the present disclosure has the same effects as described above in terms of RonA and reverse conductivity characteristics.

The above description is merely illustrative of the technical spirit of the present disclosure. It will be apparent to those skilled in the art that various modifications and variations can be made in the present disclosure without departing from the spirit and scope of the disclosure.

Therefore, the embodiments disclosed in the present disclosure are merely illustrative of the technical spirit of the present disclosure. The scope of the technical spirit of the present disclosure is not limited by these embodiments.

The scope of the present disclosure should be defined by the appended claims, and all technical ideas within the scope equivalent thereto should be construed as being within the scope of the present disclosure.

INDUSTRIAL APPLICABILITY

The present disclosure can provide a metal-oxide semiconductor field effect transistor (MOSFET) device formed of silicon carbide (SiC), and a method for manufacturing the same.

The invention claimed is:

1. A method for manufacturing a metal-oxide semiconductor field effect transistor (MOSFET) device comprising:
    forming a first mask for forming a plurality of arranged well layer regions on a drift layer;
    forming a plurality of well layer regions using the first mask;
    forming a second mask on the first mask and the well layer regions;
    selectively removing the second mask;
    forming an N+ region on each well layer region using the second mask;
    removing the first mask and the second mask;
    forming a third mask covering neighboring N+ regions;
    forming a P+ region using the third mask;
    forming a Schottky contact region,
    wherein the forming the P+ region using the third mask is performed in a first region of the device,
    wherein the forming the Schottky contact region is performed in a second region spaced apart from the first region, and
    wherein a width between two neighboring well layer regions in the first region is substantially the same as a width between two neighboring well layer regions in the second region.

2. The method according to claim 1, wherein the forming the P+ region includes forming the P+ region between two well layer regions separated from each other.

3. The method according to claim 1, wherein the first mask is configured such that mask regions having different widths are alternately formed along a surface of the drift layer.

4. The method according to claim 1, wherein the second mask is continuously disposed on the first mask and the well layer region.

5. The method according to claim 1, wherein at least one of forming the plurality of well layer regions, forming the N+ region, and forming the P+region is formed by ion implantation.

6. The method according to claim 1, wherein, in the forming the Schottky contact region, the P+ region is not formed in the second region.

7. The method according to claim 1, wherein the first region and the second region are spaced apart from each other in a direction perpendicular to an arrangement direction of the well layer regions.

8. The method according to claim 1, wherein at least one of the first region and the second region is repeatedly arranged in a direction perpendicular to an arrangement direction of the well layer regions.

9. The method according to claim 1, wherein the Schottky contact region forms a portion of a Schottky barrier diode (SBD).

10. The method according to claim 1, wherein the Schottky contact region is disposed between the two neighboring well layer regions.

\* \* \* \* \*